United States Patent
Sakai et al.

(10) Patent No.: US 9,599,944 B2
(45) Date of Patent: Mar. 21, 2017

(54) METHOD OF MOUNTING ELECTRONIC PART, CIRCUIT SUBSTRATE, AND IMAGE FORMING APPARATUS

(71) Applicant: CANON KABUSHIKI KAISHA, Tokyo (JP)

(72) Inventors: Masayuki Sakai, Yokohama (JP); Takahiro Yoneyama, Tokyo (JP); Fumiyuki Yamatsuka, Moriya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/259,547

(22) Filed: Apr. 23, 2014

(65) Prior Publication Data

US 2014/0319200 A1  Oct. 30, 2014

(30) Foreign Application Priority Data

Apr. 30, 2013 (JP) .................................. 2013-095494

(51) Int. Cl.
| | |
|---|---|
| G03G 15/00 | (2006.01) |
| H05K 13/00 | (2006.01) |
| H05K 3/34 | (2006.01) |

(52) U.S. Cl.
CPC ....... *G03G 15/5054* (2013.01); *H05K 3/3431* (2013.01); *B23K 2201/36* (2013.01); *G03G 2215/0132* (2013.01); *G03G 2215/0164* (2013.01); *G03G 2215/16* (2013.01); *H05K 2201/10106* (2013.01); *H05K 2201/10484* (2013.01); *Y02P 70/613* (2015.11)

(58) Field of Classification Search
None
See application file for complete search history.

(56) References Cited

U.S. PATENT DOCUMENTS

| | | | | |
|---|---|---|---|---|
| 5,119,240 | A | * 6/1992 | Marion et al. | ................. 359/850 |
| 5,478,778 | A | * 12/1995 | Tanisawa | ................. G02B 6/42 |
| | | | | 228/180.22 |
| 5,867,638 | A | 2/1999 | Sakai et al. | |
| 6,028,011 | A | * 2/2000 | Takase | .................... H01L 24/14 |
| | | | | 257/E23.021 |
| 6,184,560 | B1 | * 2/2001 | Kawai | ................. H01L 31/0203 |
| | | | | 257/415 |

(Continued)

FOREIGN PATENT DOCUMENTS

| | | |
|---|---|---|
| JP | 06-302945 A | 10/1994 |
| JP | 2002-076602 A | 3/2002 |

*Primary Examiner* — Devang R Patel
(74) *Attorney, Agent, or Firm* — Fitzpatrick, Cella, Harper & Scinto

(57) ABSTRACT

The circuit substrate includes at least two lands formed on a substrate, wherein one electrode is to be mounted on the at least two lands, an electronic part having electrodes, one of the electrodes is soldered on the at least two lands with solders whose amounts are adjusted by a metal mask having at least two opening parts, positions of the at least two opening parts corresponding to the at least two lands when the solders are applied and melted, areas of the at least two opening parts being different with each other, wherein a height of one of the solders is different from a height of the other of the solders according to the difference of the areas of the at least two opening parts of the metal mask, whereby the electronic part is mounted on the circuit substrate in an inclined state.

4 Claims, 9 Drawing Sheets

(56) References Cited

U.S. PATENT DOCUMENTS

| | | | | |
|---|---|---|---|---|
| 6,666,368 B2* | 12/2003 | Rinne | ........................ | 228/180.22 |
| 6,965,552 B2* | 11/2005 | Tokuda | .................. | G11B 7/127 |
| | | | | 228/180.22 |
| 7,213,740 B2* | 5/2007 | Rinne | ........................ | 228/180.22 |
| 7,393,719 B2* | 7/2008 | Odegard | ................. | H01L 24/81 |
| | | | | 257/738 |
| 2010/0230152 A1* | 9/2010 | Kitagawa | ........................ | 174/260 |
| 2011/0057216 A1* | 3/2011 | Chiu | .................. | H01L 31/0203 |
| | | | | 257/98 |
| 2013/0322913 A1 | 12/2013 | Sugiyama et al. | | |

\* cited by examiner

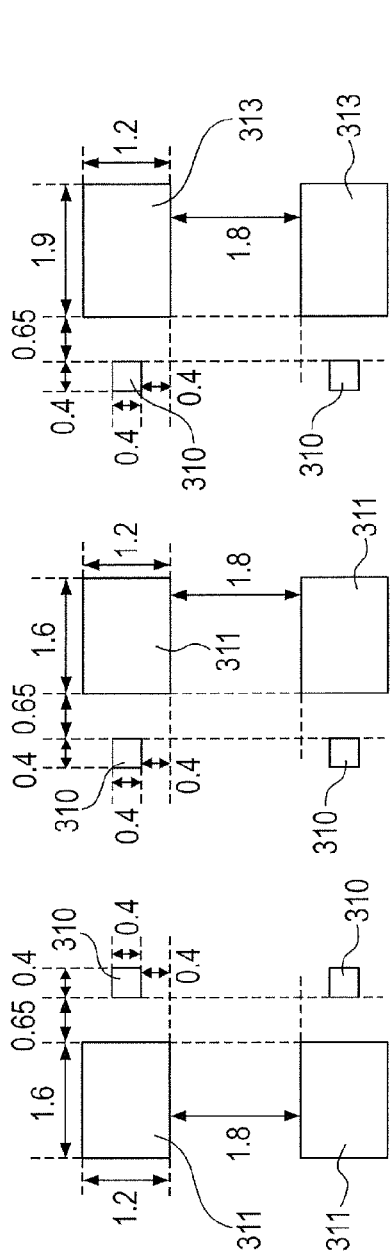
FIG. 3C
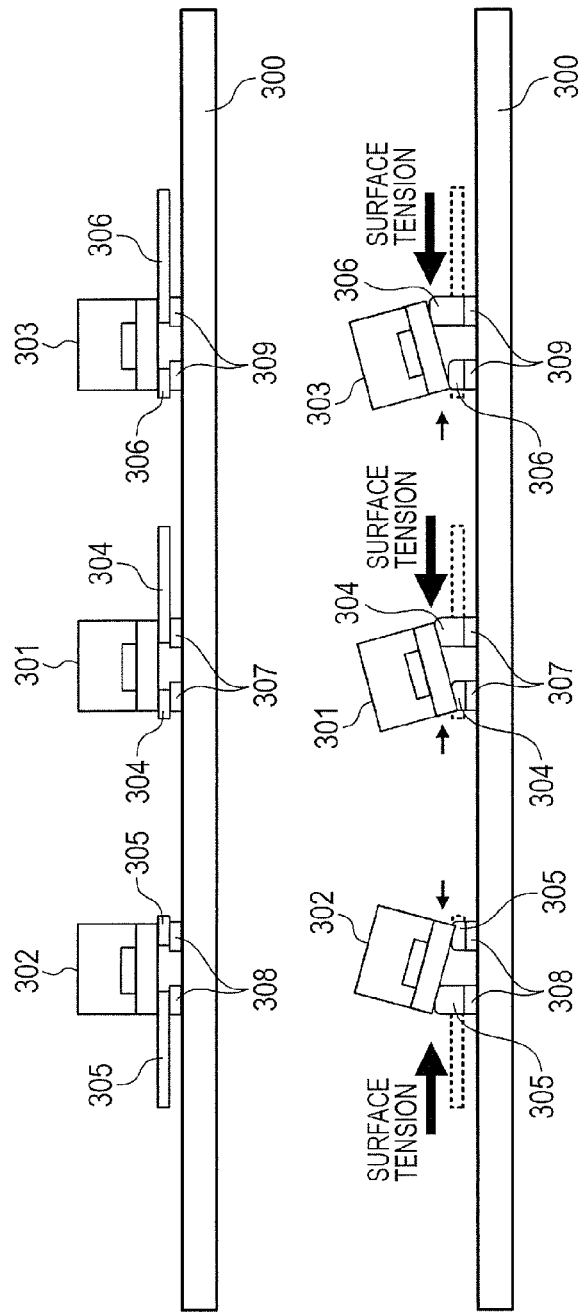
FIG. 3D
FIG. 3E

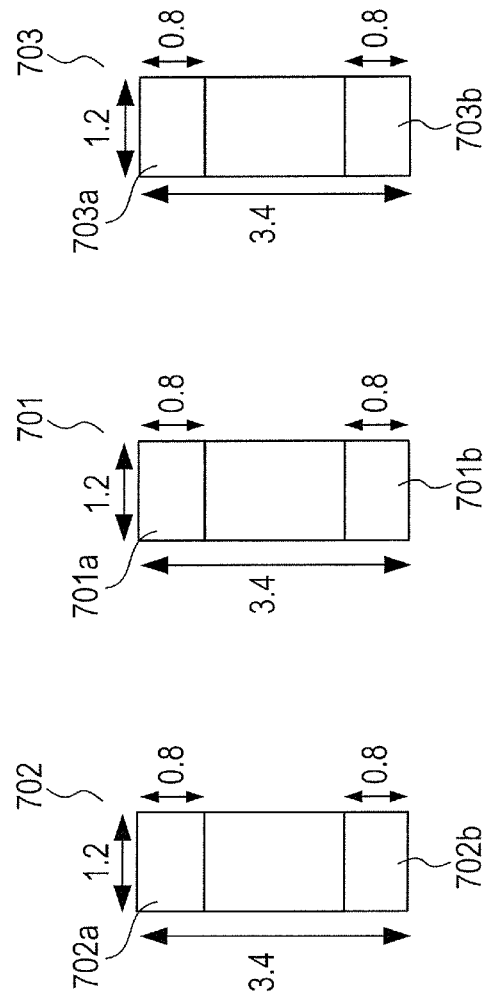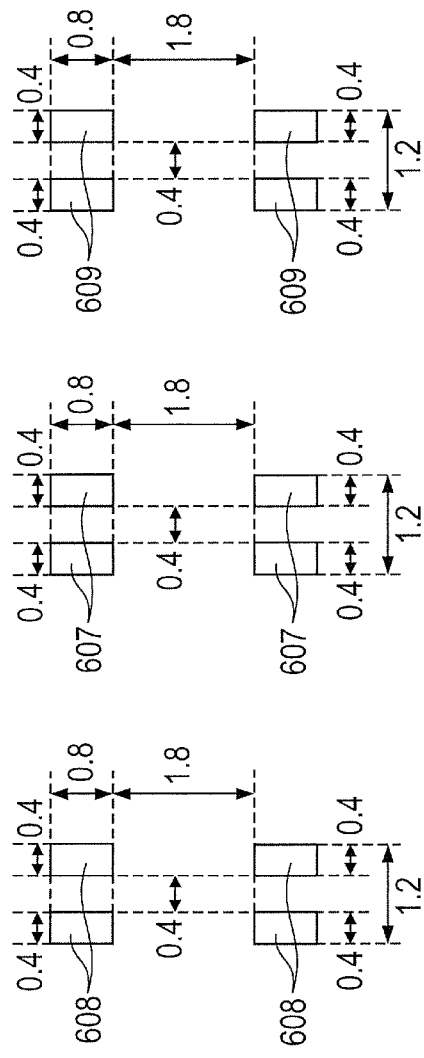
FIG. 5A
FIG. 5B

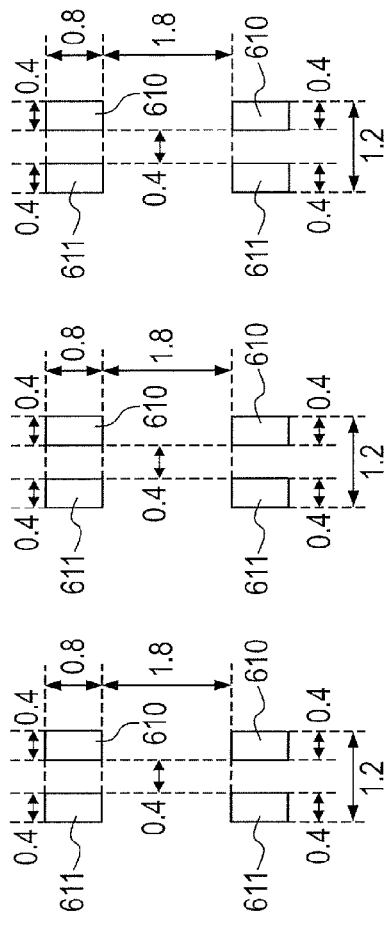
FIG. 5C
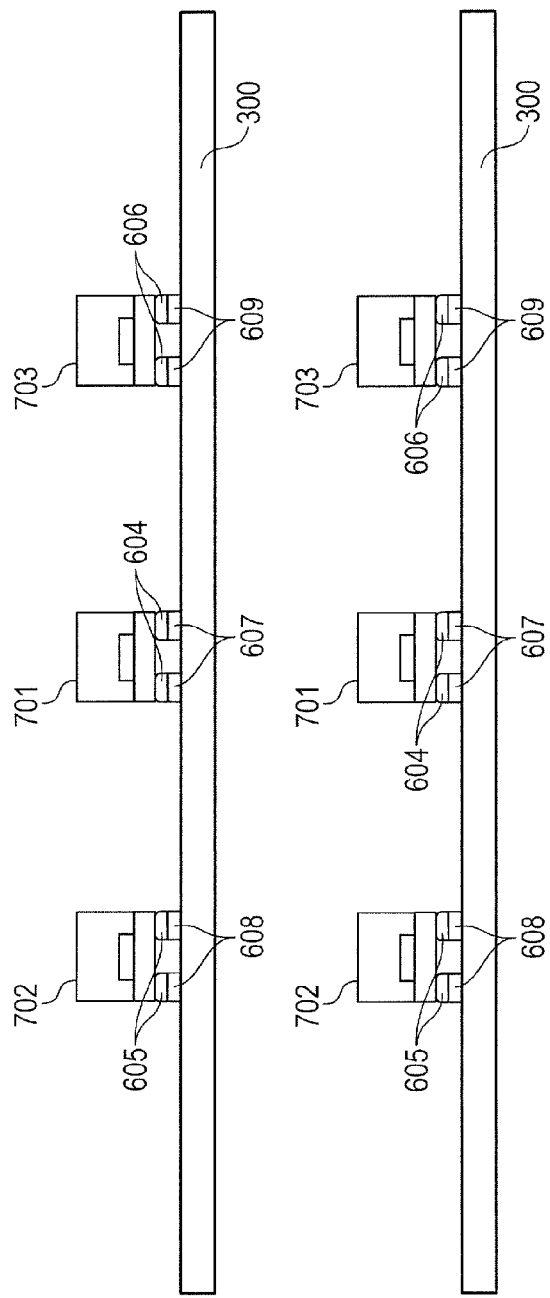
FIG. 5D
FIG. 5E

METHOD OF MOUNTING ELECTRONIC PART, CIRCUIT SUBSTRATE, AND IMAGE FORMING APPARATUS

BACKGROUND OF THE INVENTION

Field of the Invention

The present invention relates to a method of mounting an electronic part, a circuit substrate, and an image forming apparatus. In particular, the present invention relates to a method of mounting an image density detector including a light emitting element and a light receiving element.

Description of the Related Art

A color image forming apparatus is required to have precise color reproducibility and tint stability, and therefore some color image forming apparatus have an automatic image density control function. In particular, because the tint is changed due to a change of operating environment or use histories of various consumable items, it is necessary to regularly perform the image density control so as to always stabilize the tint. In order to perform this image density control, there is known a structure in which the image forming apparatus includes an optical image density detector for detecting a toner image (test toner patch) formed on an image bearing member such as an intermediate transfer belt. The image forming apparatus detects the test toner patch on the intermediate transfer belt by using the optical image density detector, and uses a toner adhesion amount calculated from a result of the detection for image adjustment.

In general, the optical image density detector has a detection structure in which light emitted from a light emitting element passes through a fine opening part (fine hole) having a diameter of approximately a few mm and irradiates the intermediate transfer belt or the toner patch on the intermediate transfer belt, and reflection light is detected by a light receiving element. The image forming apparatus calculates the toner adhesion amount on the intermediate transfer belt based on a light amount received by the light receiving element. In the image density detector, it is an important function affecting image adjustment performance to allow stable light to pass through the fine opening part having a diameter of approximately a few mm so as to detect a light amount variation of the toner patch with high accuracy.

The light emitting element and the light receiving element (hereinafter referred generically to as a light element) have an angle dependence of each of the light emission amount and light reception sensitivity. In addition, a positional displacement of the light element with respect to the opening part greatly affects a light emission amount and a light reception amount after passing through the opening part. Therefore, mounting position accuracy and inclination accuracy of the light element with respect to a position of the opening part are important. As measures for improving the mounting position accuracy of the light element, various related-art methods are proposed. For instance, there is known a mounting method involving using surface tension of molten solder to arrange light elements in a self-alignment manner (see, for example, Japanese Patent Application Laid-Open No. 2002-076602). In addition, there is known a mounting method involving disposing high stiffness indenters on an element to be mounted on the substrate, and integrally pressing the indenters with the use of a diaphragm to join the element and the substrate (see, for example, Japanese Patent Application Laid-Open No. H06-302945).

By using those measures, it is possible to mount the light element on the substrate with little variation in mounting position of the light element.

However, in the related-art method of mounting the light element on the substrate in the image density detector, solder 1001 after a heating process has a spherical shape as illustrated in FIG. 7, and hence a light element 1002 is apt to be unstable on the spherical solder 1001 and to be inclined (in a double-headed arrow direction in FIG. 7). Therefore, a mounting angle of the light element 1002 on a circuit substrate 300 with respect to an opening part 312 may not be good, and hence performance of an image density detector 2000 may be deteriorated. Note that, FIG. 7 is a diagram of a cross section of the image density detector 2000 as viewed from the side face, and like reference numerals and symbols denote like structures to those in the embodiments described later so that description thereof is omitted.

SUMMARY OF THE INVENTION

The present invention has been made in view of such circumstances, and enables to mount an electronic part on a circuit substrate with a good angle.

In order to solve the above-mentioned problem, a purpose of the present invention is to provide a method of mounting an electronic part having electrodes on a circuit substrate having at least two lands on which one of the electrodes is to be mounted, wherein the method includes preparing a metal mask having at least two opening parts, positions of the at least two opening parts corresponding to the at least two lands, areas of the at least two opening parts being different with each other, applying solders on the at least two lands through the at least two opening parts of the metal mask to adjust amounts of the solders by the differences of the areas of the at least two opening parts, placing the electrodes of the electronic part on the multiple lands; and melting the solders on the at least one land so that a height of one of the solders is different from a height of the other of the solders according to the amounts of the differences, whereby the electronic part is mounted on the circuit substrate in an inclined state.

Another purpose of the present invention is to provide a circuit substrate including at least two lands formed on a substrate, wherein one electrode is to be mounted on the at least two lands, and an electronic part having electrodes, one of the electrodes is soldered on the at least two lands with solders whose amounts are adjusted by a metal mask having at least two opening parts, positions of the at least two opening parts corresponding to the at least two lands when the solders are applied and melted, areas of the at least two opening parts being different with each other, wherein a height of one of the solders is different from a height of the other of the solders according to the difference of the areas of the at least two opening parts of the metal mask, whereby the electronic part is mounted on the circuit substrate in an inclined state.

A further purpose of the present invention is to provide an image forming apparatus including an image forming unit configured to form a toner image on an image bearing member, a transfer unit configured to transfer the toner image formed by the image forming unit onto an intermediate transfer member, and a detection unit configured to detect the toner image transferred by the transfer unit, wherein the image forming apparatus controls an image forming operation of the image forming unit based on a result of detection by the detection unit, wherein the detection unit includes the circuit substrate.

A still further purpose of the present invention is to provide an image forming apparatus including an image forming unit configured to form an image on a recording material, and a detection unit configured to detect presence and absence of the recording material, wherein the image forming apparatus is configured to perform control concerning an image forming operation of the image forming unit based on a result of the detection by the detection unit, wherein the detection unit includes the circuit substrate.

A still further purpose of the present invention is to provide circuit substrate for mounting an electronic part having at least two electrodes, wherein the circuit substrate comprises at least two lands, wherein one of the at least two electrodes is to be mounted on the at least two lands, wherein one of the electrodes is to be soldered on the at least two lands with solders whose amounts are adjusted by a metal mask having at least two opening parts, positions of the at least two opening parts corresponding to the at least two lands when the solders are applied and melted, areas of the at least two opening parts being different with each other, wherein a height of one of the solders is different from a height of the other of the solders according to the difference of the areas of the at least two opening parts of the metal mask, whereby the electronic part is to be mounted on the circuit substrate in an inclined state.

Further features of the present invention will become apparent from the following description of exemplary embodiments with reference to the attached drawings.

BRIEF DESCRIPTION OF THE DRAWINGS

FIG. 3C is a diagram illustrating opening part shapes of a metal mask that is used when the light elements are mounted on the circuit substrate according to the first embodiment.

FIG. 3D is a schematic diagram illustrating a state before solder is melted when the light elements are mounted on the circuit substrate according to the first embodiment.

FIG. 3E is a schematic diagram illustrating a state in which the circuit substrate is heated in a reflow oven so as to melt the solder when the light elements are mounted on the circuit substrate according to the first embodiment.

FIG. 5A is a diagram illustrating footprint portions of light elements when the light elements are mounted on a circuit substrate according to the second embodiment.

FIG. 5B is a diagram illustrating electrode lands corresponding to electrodes of the light elements when the light elements are mounted on the circuit substrate according to the second embodiment.

FIG. 5C is a diagram illustrating opening part shapes of a metal mask that is used when the light elements are mounted on the circuit substrate according to the second embodiment.

FIG. 5D is a schematic diagram illustrating a state before solder is melted when the light elements are mounted on the circuit substrate according to the second embodiment.

FIG. 5E is a schematic diagram illustrating a state in which the circuit substrate is heated in the reflow oven so as to melt the solder when the light elements are mounted on the circuit substrate according to the second embodiment.

DESCRIPTION OF THE EMBODIMENTS

Now, embodiments of the present invention are described in detail with reference to the drawings.

First Embodiment

Description of Image Forming Apparatus

Figure 1:
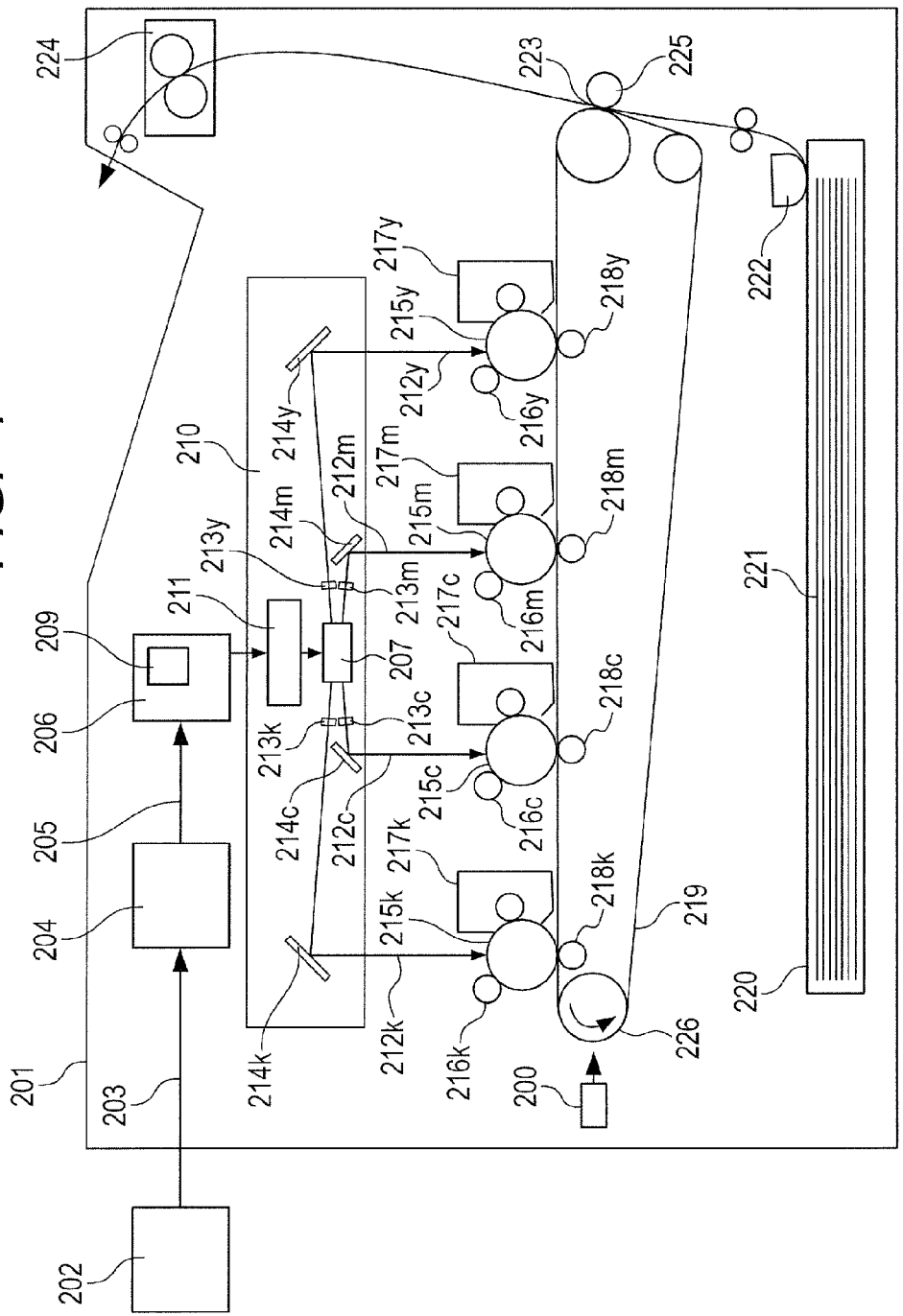
FIG. 1 is a cross-sectional view illustrating a color image forming apparatus according to first to third embodiments of the present invention.

FIG. 1 is a schematic cross-sectional view illustrating a structure of a color laser beam printer 201 serving as an image forming apparatus according to a first embodiment of the present invention. The color laser beam printer 201 of this embodiment includes a four-color image forming portion for superimposing four-color (yellow (Y), magenta (M), cyan (C), and black (Bk)) images so as to form a full color image. When the color laser beam printer 201 (hereinafter referred to as a printer 201) receives image data 203 from a host computer 202, a print image generating portion 204 in the printer 201 expands the image data 203 into desired video signal format data. The print image generating portion 204 expands the image data 203 into the desired video signal format data so as to generate a video signal 205 for forming an image.

An image formation control portion 206 includes an arithmetic processing unit such as a CPU 209. The video signal 205 generated by the print image generating portion 204 is transmitted from the print image generating portion 204 to the image formation control portion 206 so as to drive multiple laser diodes 211 serving as laser light emitting elements in a scanner unit 210 in accordance with the video signal 205. The laser diodes 211 emit laser beams 212y, 212m, 212c, and 212k. Here, y represents yellow, m represents magenta, c represents cyan, and k represents black, which are omitted unless otherwise necessary in the following description. The laser beam 212 emitted from the laser diode 211 irradiates a photosensitive drum 215 via a rotating polygon mirror 207, a lens 213, and a reflection mirror 214. Because the photosensitive drum 215 is charged by a charging unit 216 at a desired charge amount, the laser beam 212 irradiates the photosensitive drum 215 to partially decrease a surface potential, to thereby form an electrostatic latent image on a surface of the photosensitive drum 215. The electrostatic latent image formed by irradiating the photosensitive drum 215 with the laser beam 212 is developed by a developing unit 217 so that a toner image is formed on the photosensitive drum 215.

The toner image formed on the photosensitive drum 215 serving as an image bearing member is transferred onto an endless belt (hereinafter referred to as an intermediate transfer belt) 219 serving as an intermediate transfer member by applying an appropriate primary transfer voltage to a primary transfer member 218 (hereinafter referred to as primary transfer). First, a yellow image is primarily transferred onto the intermediate transfer belt 219. On the transferred yellow image, a magenta image, a cyan image, and a black image are primarily transferred in a sequential manner so that a full color image is formed. Further, a drive roller 226 is driven in a counterclockwise direction (in an arrow direction in FIG. 1), and the intermediate transfer belt 219 is controlled to move by the drive roller 226. A recording sheet 221 serving as a recording material in a cassette 220 is fed by a sheet feeder roller 222, and then is conveyed to a secondary transfer portion 223 in synchronization with the image transferred primarily onto the intermediate transfer belt 219. Then, a secondary transfer roller 225 performs image transfer (hereinafter referred to as secondary transfer) so that the image is transferred onto the recording sheet 221. In this case, a predetermined secondary transfer voltage is applied to the secondary transfer roller 225 so that transfer efficiency is enhanced. The recording sheet 221 on which the image is secondarily transferred undergoes a fixing process by heat and pressure applied from a fixing unit 224, and is discharged from a sheet discharging portion after a stable color image is fixed on the recording sheet 221.

In addition, an image density detector 200 serving as a detection unit is a sensor for detecting a correction pattern for detecting an image density amount and a positional displacement amount of each color image transferred onto the intermediate transfer belt 219. The image density detector 200 detects a position of the correction pattern of each color formed on the intermediate transfer belt 219 at a predetermined timing, and feeds back a result of the detection to the CPU 209 and the image formation control portion 206 in order to control image forming operation based on the result of the detection. In this way, the CPU 209 performs image density adjustment and positional displacement correction of each color toner image in a main scanning direction and in a sub scanning direction among the respective colors. Here, the conveyance direction of the recording sheet 221 is referred to as the sub scanning direction, and the direction perpendicular to the conveyance direction of the recording sheet 221 is referred to as the main scanning direction.

Description of Image Density Detector

Figure 2:
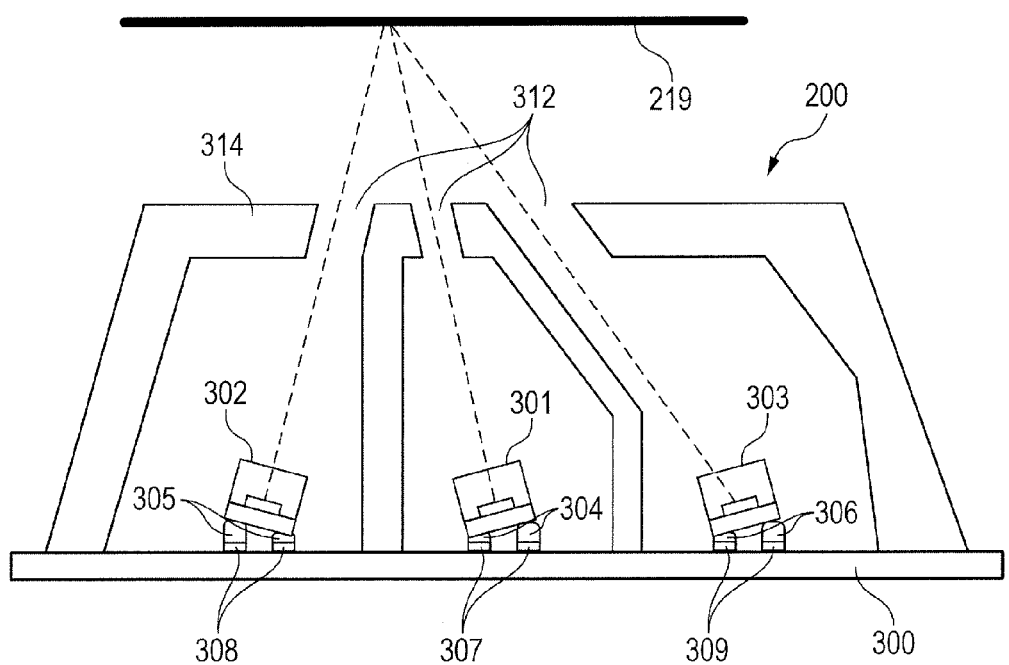
FIG. 2 is a diagram illustrating an image density detector according to the first embodiment.

FIG. 2 is a diagram illustrating a structure of the image density detector 200 of this embodiment. A circuit substrate 300 includes an LED 301 serving as a light emitting element, a regular reflection phototransistor (hereinafter referred to as a regular reflection Ptr) 302 serving as a light receiving element, and an irregular reflection phototransistor (hereinafter referred to as an irregular reflection Ptr) 303 serving as a light receiving element. Further, the LED 301, the regular reflection Ptr 302, and the irregular reflection Ptr 303 are referred to as light elements. In addition, the image density detector 200 includes a lid 314 covering the circuit substrate 300. The lid 314 has opening parts (fine opening parts) 312 through which light emitted from the LED 301 passes at a certain angle. In other words, the opening parts 312 are formed at such positions of the lid 314 that light passes through the opening parts 312 at predetermined angles from the direction perpendicular to the circuit substrate 300. The image density detector 200 in which the lid 314 and the circuit substrate 300 having the light elements serving as electronic parts mounted thereon are combined is disposed to be opposed to the intermediate transfer belt 219 in the printer 201 (see FIG. 1).

The regular reflection Ptr 302 receives regular reflection light having an angle of reflection light that is the same as that of incident light emitted from the LED 301 to the intermediate transfer belt 219. One of roles of the regular reflection Ptr 302 is to detect a high density toner patch. On the other hand, the irregular reflection Ptr 303 receives irregular reflection light having an angle of reflection light that is different from that of the incident light. A role of the irregular reflection Ptr 303 is to detect a low density toner patch. In addition, the regular reflection Ptr 302 and the irregular reflection Ptr 303 have roles to detect positions of the Y, M, C, and K color toner patches. As a diameter of the opening part (fine opening part) 312 is smaller, a more restricted angle of reflection light can be detected, and hence the high density toner patch and the low density toner patch can be detected with higher accuracy. In addition, as the diameter of the opening part 312 is smaller, the position can be detected with higher accuracy.

However, as the diameter of the opening part (fine opening part) 312 is smaller, an optical directivity angle of the LED 301, the regular reflection Ptr 302, or the irregular reflection Ptr 303 becomes more sensitive. Therefore, as the diameter of the opening part 312 is smaller in the image density detector 200, decrease in light amount due to a variation of the mounting position of the light element or a variation of the mounting angle thereof becomes more conspicuous. Therefore, in order to perform image adjustment with good quality, it is required to realize mounting of light elements capable of emitting or receiving stable light while reducing the diameter of the opening part 312. In order to realize the image density detector 200 capable of receiving stable light, it is effective to mount the light element in the direction of the opening part 312 without variations of the mounting position and the mounting angle as illustrated in FIG. 2. In this embodiment described herein, as a unit for controlling the mounting angle, as illustrated in FIG. 2, there are used electrode lands 307, 308, and 309 of the LED 301, the regular reflection Ptr 302, and the irregular reflection Ptr 303, and solders 304, 305, and 306 on the electrode lands 307, 308, and 309.

Mounting Structure and Mounting Procedure of Light Element

Figure 3A:
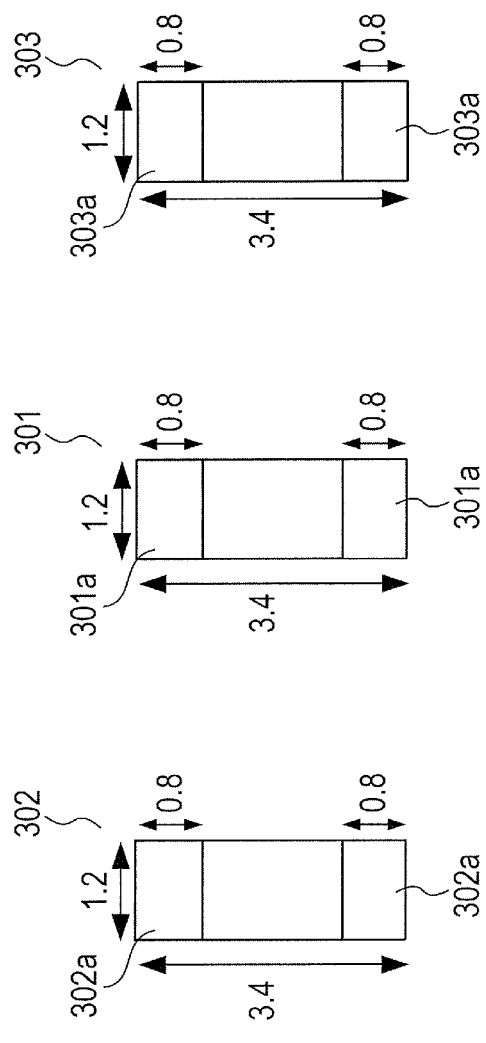
FIG. 3A is a diagram illustrating footprint portions of light elements when the light elements are mounted on a circuit substrate according to the first embodiment.
Figure 3B:
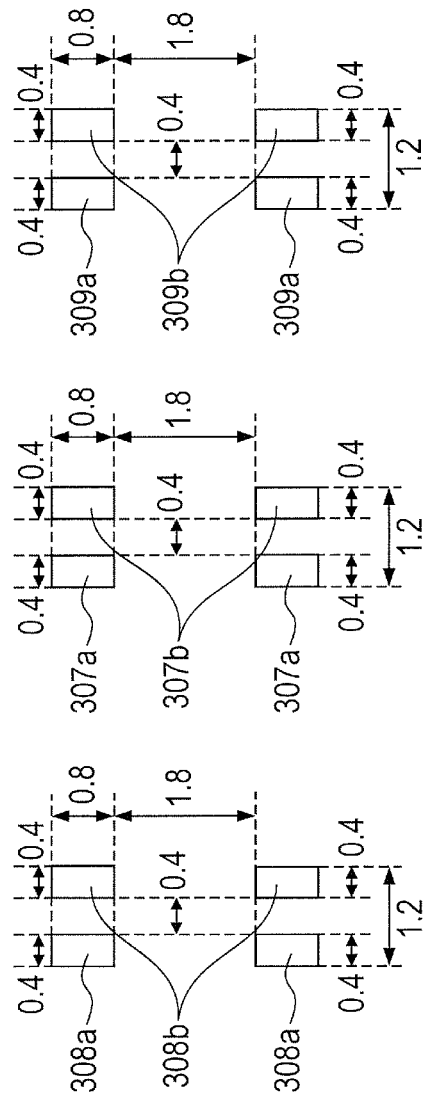
FIG. 3B is a diagram illustrating electrode lands corresponding to electrodes of the light elements when the light elements are mounted on the circuit substrate according to the first embodiment.

FIGS. 3A to 3E are diagrams illustrating a mounting structure and a mounting procedure of light elements of this embodiment. FIG. 3A is a top view of the LED 301, the regular reflection phototransistor (hereinafter referred to as a "regular reflection Ptr") 302, and the irregular reflection phototransistor (hereinafter referred to as the "irregular reflection Ptr") 303. FIG. 3B is a top view illustrating land shapes of electrodes for mounting the LED 301, the regular reflection Ptr 302, and the irregular reflection Ptr 303. In addition, FIG. 3C is a top view illustrating opening part shapes in a metal mask at mounting positions of the LED 301, the regular reflection Ptr 302, and the irregular reflection Ptr 303. Further, FIG. 3D is a side view illustrating solder shapes before a heating process when the LED 301, the regular reflection Ptr 302, and the irregular reflection Ptr 303 serving as the light elements are mounted. FIG. 3E is a side view illustrating solder shapes after the heating process.

In this embodiment, as illustrated in FIG. 3A, the LED 301, the regular reflection Ptr 302, and the irregular reflection Ptr 303 serving as the light elements have dimensions of 1.2 mm on a short side and 3.4 mm on a long side. Electrodes 301a, 302a, and 303a have dimensions of 1.2 mm by 0.8 mm. Herein, a circuit substrate is prepared so that at least two lands correspond to one electrode corresponds. In this embodiment, the electrode lands 307, 308 and 309 on the circuit substrate 300 are prepared so that the electrode lands 307 correspond to the electrode 301a, the electrode lands 308 correspond to the electrode 302a, and the electrode lands 309 correspond to the electrode 303a. Compared to the conventional type of the circuit substrate, it can be understood that the conventional type of the lands to be connected to one electrode is separated into multiple lands to be connected to one electrode. In this specification, to prepare the multiple lands to be connected to one electrode is hereinafter referred to as "separated." As a typical example in this embodiment, the electrodes of the light element having dimensions of 1.2 mm by 0.8 mm are disposed at two parts in a separated manner. As an example, the electrode land 307 is described. The LED 301 has two electrodes 301a, and two electrode lands 307a and 307b, each of which has dimensions of 0.4 mm by 0.8 mm, are disposed on the substrate 300 for the two respective electrodes 301a. The same is true for the regular reflection Ptr 302 and the irregular reflection Ptr 303. In other words, in the electrode lands 307, 308, and 309 illustrated in FIG. 3B, two electrode lands 307a and 307b, 308a and 308b, and 309a and 309b having dimensions of 0.4 mm by 0.8 mm are disposed for the respective electrodes 301a, 302a, and 303a. Thus, in this embodiment, the electrode land corresponding to one electrode of the light element is separated into multiple (two in this embodiment) parts. The pair of separated electrode lands 307a and 307b are separated from each other by a distance of 0.4 mm (=1.2−0.4×2). The same is true for a distance between the pair of electrode lands 308a and 308b, as well as the pair of electrode lands 309a and 309b. The distance between the pair of electrode lands 307a and 307b, 308a and 308b, and 309a and 309b may be changed as long as a solder bridge is not finally formed between the separated electrodes. In this embodiment, the separated electrode land has dimensions of 0.4 mm by 0.8 mm and an area of 0.32 mm² in the following description.

Next, with reference to FIG. 3C, an opening part shape of the metal mask for applying solder to upper surfaces of the electrode lands is described. The opening part shape of the metal mask of this embodiment is as follows. When mounting the light element in an inclined state, a size of a metal mask opening part 310 for the electrode land at which the height from the circuit substrate 300 is to be smaller is set smaller, and a size of a metal mask opening part 311 for the electrode land at which the height from the circuit substrate 300 is to be larger is set larger. In the following description, when mounting the light element in an inclined state, a side on which the height of the light element from the circuit substrate 300 is to be smaller is referred to as a "lower side" and a side on which the height of the light element from the circuit substrate 300 is to be larger than a predetermined height is referred to as a "higher side".

In addition, when mounting the light element in an inclined state, the lower side is a fulcrum of the inclination. For instance, the height of the light element from the circuit substrate 300 on the lower side is set to a predetermined height as a reference height. The height on the higher side is set to be larger than the predetermined height so that the inclination of the light element is adjusted. Therefore, first, a predetermined area of the metal mask opening part corresponding to the electrode land at which the height of the light element on the lower side becomes the predetermined height is determined. On the higher side, an area of a metal mask opening part corresponding to the electrode land is set to be larger than the predetermined area so that the height of the light element from the circuit substrate 300 becomes larger than the predetermined height.

In this way, the solder amount on the lower side is set to be smaller while the solder amount on the higher side is set to be larger, and hence bases having different solder amounts are formed so that the light element is inclined. In this embodiment, as the area of the opening part shape of the metal mask is larger, the solder amount applied to the electrode land becomes lager. Therefore, when inclining the light element in this embodiment, as to opening part dimensions of the metal mask, the dimensions of the smaller opening part 310 on the lower side are set to 0.4 mm by 0.4 mm (area of 0.16 mm²) while the dimensions of the larger opening part 311 on the higher side are set to 1.6 mm by 1.2 mm (area of 1.92 mm²). The dimensions of the larger opening part 311 on the higher side may be increased up to 2.0 mm by 1.2 mm (area of 2.4 mm²). In this embodiment, when mounting the irregular reflection Ptr 303 in an inclined state, as illustrated in FIG. 3C, a larger opening part 313 of the metal mask for the electrode land on the higher side has larger dimensions of 1.9 mm by 1.2 mm (area of 2.28 mm²) than the area of the larger opening part 311 of the metal mask corresponding to the LED 301 and the regular reflection Ptr 302.

In addition, as a difference between the area of the larger opening part 311 on the higher side and the area of the smaller opening part 310 on the lower side is larger, a difference between solder amounts becomes larger, and the inclination angle of the light element mounted on the circuit substrate 300 becomes larger. In other words, as a difference between areas of the opening part on one end and the opening part on the other end of the metal mask among the at least two opening parts, or preferably more opening parts corresponding to the electrode lands is larger, the inclination angle of the mounted light element becomes larger. As described above, the area of the larger opening part 313 of the metal mask corresponding to the irregular reflection Ptr 303 is larger than the area of the larger opening part 311 of the metal mask corresponding to the LED 301 and the regular reflection Ptr 302. Because the smaller opening parts 310 of the metal mask have the same area, a difference between areas of the smaller opening part and the larger opening part 313 of the metal mask is larger than a difference between areas of the smaller opening part and the larger opening part 311 of the metal mask. Therefore, the inclination angle of the mounted irregular reflection Ptr 303 becomes lager than the inclination angle of the mounted LED 301 and the mounted regular reflection Ptr 302.

Here, the reason why the area of the larger opening part 311 is restricted between the lower limit of 1.92 mm² to the upper limit of 2.4 mm² is as follows. When the area is 1.92 mm² or smaller, the solder amount is small, and hence the light element is not stably inclined. In addition, when the area is 2.4 mm² or larger, the solder amount is excessively large, and hence a solder bridge is formed between the separated electrode lands, with the result that the light element is not stably inclined.

Further, it is preferred to change the area of the opening part of the metal mask depending on a thickness of the metal mask so that a final solder amount (for example, volume (mm³)) becomes the same. It is because in the case of setting the same amount (that is, the same volume) of the solder to be applied to the electrode land, as the thickness of the metal mask is larger, the area of the opening part of the metal mask needs to be set to be smaller. In this embodiment, the thickness of the metal mask is 120 µm, and the thickness of the solder to be applied to the electrode land is set to be 120 µm. Therefore, in this embodiment, as to the solder amount for the separated electrode area of 0.32 mm², the solder amount of the smaller opening part 310 is set to 0.0192 mm³ (=0.4 mm by 0.4 mm by 120 µm). On the other hand, the solder amount of the larger opening part 311 is preferably from a lower limit of 0.2304 mm³ (=1.6 mm by 1.2 mm by 120 µm) to an upper limit of 0.288 mm³ (=2.0 mm by 1.2 mm by 120 µm). In addition, because a distance of 0.65 mm between the larger opening part 311 and the smaller opening part 310 of the metal mask is larger than the distance of 0.4 mm between the pair of separated electrode lands 307, 308, and 309 (307a and 307b, 308a and 308b, and 309a and 309b) illustrated in FIG. 3B, there is an effect of suppressing a solder bridge between the electrode lands.

Next, as illustrated in FIG. 3C, after determining the opening part shape of the metal mask, the metal mask is placed on the electrode lands 307, 308, and 309 of the circuit substrate 300. Then, solder is squeezed and applied to the circuit substrate 300 through the smaller opening part 310 and the larger opening part 311 of the metal mask. Next, as illustrated in FIG. 3D, the light elements are mounted on the applied solders 304, 305, and 306. After that, the circuit substrate 300 having the light elements mounted thereon is heated in a reflow oven so that the solders 304, 305, and 306 are melted. The solders melted by heat into liquid existing outside the electrode lands, that is, the solders overflowed from the electrode lands 307, 308, and 309 in FIG. 3D are condensed into solder bumps by surface tension on the electrode lands 307, 308, and 309 as illustrated in FIG. 3E. As a result, the solder bump of the solder applied to the smaller opening part 310 of the metal mask becomes small, while the solder bump of the solder applied to the larger opening part 311 of the metal mask becomes large. In this way, the light elements can be fixed onto the solder bumps in an inclined state in different directions and at different heights as illustrated in FIG. 3E. For instance, when the regular reflection Ptr 302 is mounted, the left side in FIGS. 3D and 3E is set to the higher side while the right side is set to the lower side. In addition, when the LED 301 and the irregular reflection Ptr 303 are mounted, the right side in FIGS. 3D and 3E is set to the higher side while the left side is set to the lower side. In this way, by applying the solders to the electrode lands 307, 308, and 309 at different heights, the light elements can be mounted on the solders in an inclined state.

Using the shapes of the electrode lands and the opening part shapes of the metal mask described in this embodiment, the mounting angles of the light elements are set as follows. Specifically, when the larger opening part 311 of the metal mask illustrated in FIG. 3C has an area in the range of 1.92 mm² (=1.6 mm by 1.2 mm) to 2.4 mm² (=2.0 mm by 1.2 mm), it is possible to realize a mounting angle of the light element in the range of 9° to 16°. In this way, in this embodiment, by changing the area of the opening part shape of the metal mask so that the amount of the solder to be applied is changed, it is possible to mount the light element on the circuit substrate in an inclined state.

As described above, according to this embodiment, it is possible to mount the electronic part on the circuit substrate at an appropriate angle.

Second Embodiment

Figure 4A:
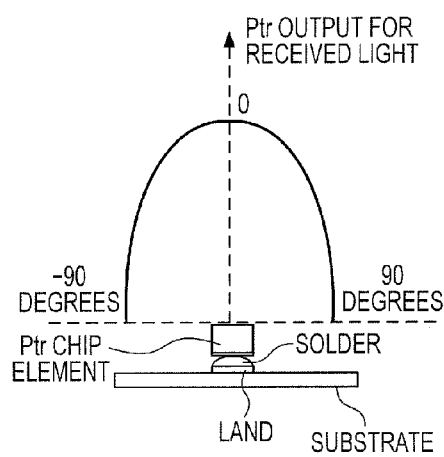
FIG. 4A shows light efficiency characteristics of a light element according to the second embodiment.

FIG. 4A is a graph showing light efficiency characteristics of the phototransistor (indicated as a Ptr chip element) according to the first embodiment. FIG. 4A shows Ptr output for received light when an angle of a cross point between a broken line and a solid line is 0°, provided that the vertical broken line indicates an angle of 0°. Further, the vertical axis of the vertical broken line also indicates the Ptr output for received light in each angle. In addition, a clockwise angle from the angle of 0° has a positive sign, and a horizontal broken line indicates an angle of 90°, at which the Ptr output for received light is substantially zero. Further, a counterclockwise angle from the angle of 0° has a negative sign, and the horizontal broken line indicates an angle of −90° at which the Ptr output for received light is substantially zero. Further, below the graph, there is illustrated a state in which the phototransistor is mounted on the solder applied to the electrode land of the substrate.

Figure 4B:
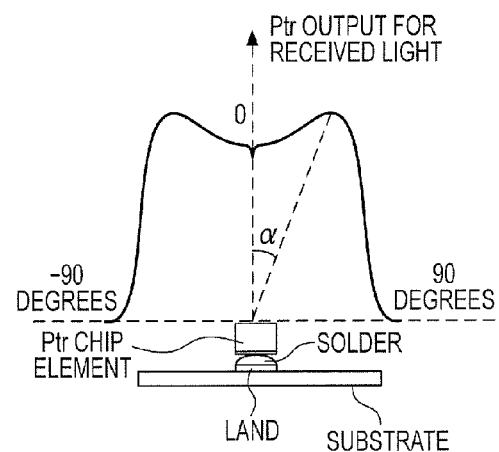
FIG. 4B shows light efficiency characteristics of a light element of an image density detector.
Figure 4C:
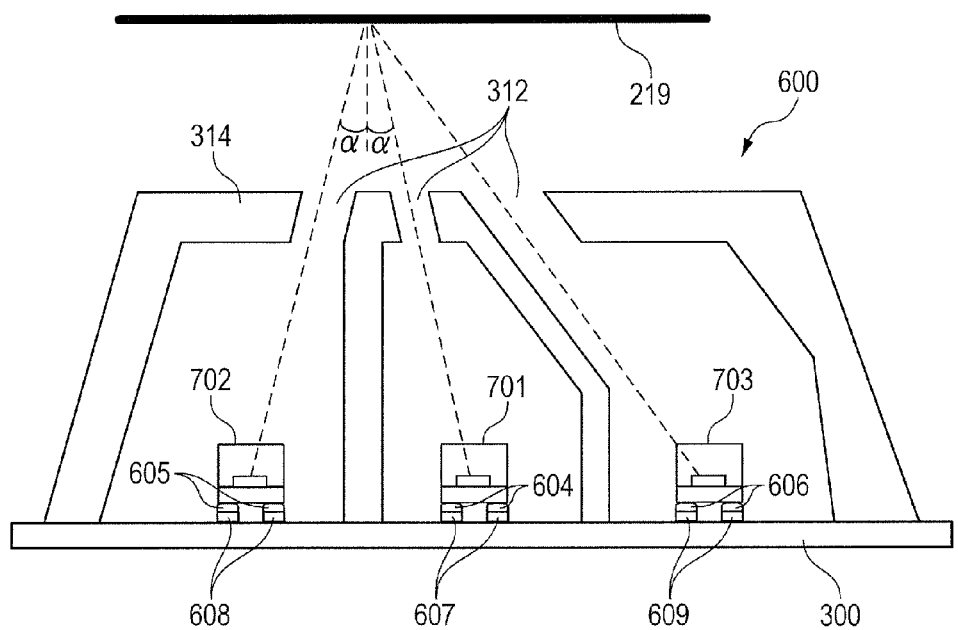
FIG. 4C is a diagram illustrating an image density detector according to the second embodiment.

As to the LED 301, the regular reflection Ptr 302, and the irregular reflection Ptr 303 according to the first embodiment, it is supposed that the highest light efficiency characteristic is obtained in the vertical direction from the upper surface of the light element as illustrated in FIG. 4A. However, there are LEDs and phototransistors in the market, which have the highest light efficiency characteristic not in the vertical direction but in a direction of an angle α° from the upper surfaces of the light elements as illustrated in FIG. 4B. Further, FIG. 4B is a graph showing the light efficiency characteristics of the light element according to a second embodiment of the present invention, which corresponds to FIG. 4A. In this embodiment, a value at a point indicated by a perpendicular line to the vertical axis corresponding to a cross point between the broken line of the angle α° and the solid line is the Ptr output for received light at the angle α°, which is the highest output. This embodiment is supposed to have a structure in which the image density detector 200 includes the light element having a high light efficiency characteristic not in the vertical direction but in a direction of the angle α°. Further, there is described a mounting unit of an image density detector 600 illustrated in FIG. 4C in which an LED 701 and a regular reflection Ptr 702 are mounted as horizontally as possible so that the light reception amount (that is, the Ptr output for received light) becomes largest. In other words, there is described an example in which when mounting the light element having the highest light efficiency characteristic not in the vertical direction but in the direction of the angle α° from the upper surface of the light element, the light element is mounted horizontally utilizing the angle α°. Further, because the light element is mounted horizontally without inclination, this embodiment can be regarded as a case where the mounting angle is 0° in the first embodiment.

Mounting Structure and Mounting Procedure of Light Element

FIGS. 5A to 5E are diagrams corresponding to FIGS. 3A to 3E described above in the first embodiment. As illustrated in FIG. 5A, dimensions of the LED 701, the regular reflection Ptr 702, and an irregular reflection Ptr 703 of this embodiment are the same as those in the first embodiment, and description thereof is omitted. First, as illustrated in FIG. 5B, each of the electrode lands of the LED 701, the regular reflection Ptr 702, and the irregular reflection Ptr 703 is separated into two parts, that is, electrode lands 607, 608, and 609 are obtained. Similarly to FIG. 3B according to the first embodiment, dimensions of the separated electrode land are 0.4 mm by 0.8 mm, and the area thereof is 0.32 mm$^2$ in the following description.

Next, as illustrated in FIG. 5C, opening part shapes of the metal mask for applying solders 604, 605, and 606 to the upper surfaces of the electrode lands 607, 608, and 609 are determined. As to the opening part shapes of the metal mask, an opening part 611 (hereinafter referred to as a left opening part) and an opening part 610 (hereinafter referred to as a right opening part) have the same opening part area of the metal mask in each pair of the separated electrode lands 607, 608, and 609. Specifically, the opening part 611 of the metal mask has dimensions of 0.4 mm by 0.8 mm and an area of 0.32 mm$^2$. Similarly, the right opening part 610 of the metal mask has dimensions of 0.4 mm by 0.8 mm and an area of 0.32 mm$^2$. In this way, in this embodiment, a ratio of the left and right opening part areas is set to 1:1. It is preferred that the opening part area of 0.32 mm$^2$ of this metal mask be smaller with respect to the area of 0.32 mm$^2$ of the electrode lands 607, 608, and 609, as long as the solders are sufficiently applied to the surfaces of the electrode lands. The reason is that a variation of the solder bumps formed on the left and right electrode lands becomes smaller as the opening part area of the metal mask is smaller. In this way, the opening part area of the metal mask is set to be smaller than or equal to the area of the electrode land corresponding to the opening part of the metal mask.

After determining the opening part shapes of the metal mask illustrated in FIG. 5C, the metal mask is placed on the circuit substrate 300, solder is squeezed and applied to the circuit substrate 300 through the opening parts of the metal mask. Next, as illustrated in FIG. 5D, the LED 701, the regular reflection Ptr 702, and the irregular reflection Ptr 703 serving as the light elements are mounted on the applied solders 604, 605, and 606. After that, as illustrated in FIG. 5E, the circuit substrate 300 having the light elements mounted thereon is heated in the reflow oven so that the solders are melted.

Using the shapes of the electrode lands and the opening part shapes of the metal mask described in this embodiment, the mounting angles of the light elements can be set as horizontal as possible in a case where the light elements have the highest light efficiency characteristic not in the vertical direction but in the direction of the angle α° from the upper surfaces of the light elements. In other words, in this embodiment, by equalizing the areas of the opening part shapes of the metal mask so that the amounts of the solder to be applied are equalized, it is possible to mount the light element on the circuit substrate in a horizontal state.

In addition, this embodiment can be regarded as a case where the light element is mounted at the angle of 0° without inclination in the first embodiment. In the case where the inclination angle of the light element from the direction perpendicular to the circuit substrate 300 is 0°, the opening part areas of the metal mask are equalized, that is, set to be 1:1 as described above.

As described above, according to this embodiment, it is possible to mount the electronic part on the circuit substrate at an appropriate angle.

Third Embodiment

In the first embodiment, the light element having particular dimensions is used, and the shape of the electrode land as well as the opening part shape of the metal mask is separated into two parts. A third embodiment of the present invention describes an example where the electrode land as well as the metal mask is separated into three or more parts as illustrated in FIG. 6B.

Mounting Structure and Mounting Procedure of Light Element

Figure 6A:
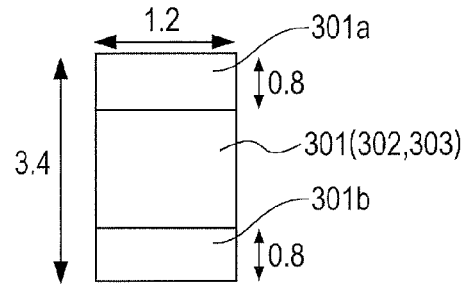
FIG. 6A is a diagram illustrating a footprint portion of a light element when the light element is mounted on a circuit substrate according to the third embodiment.
Figure 6B:
FIG. 6B is a diagram illustrating electrode lands corresponding to electrodes of the light element when the light element is mounted on the circuit substrate according to the third embodiment.
Figure 6C:
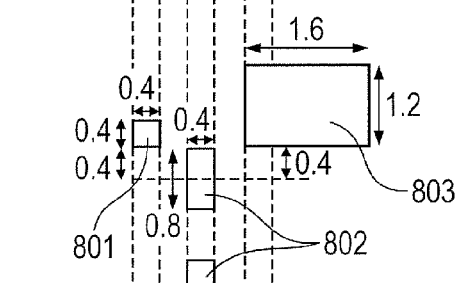
FIG. 6C is a diagram illustrating opening part shapes of a metal mask that is used when the light element is mounted on the circuit substrate according to the third embodiment.

FIGS. 6A to 6E are diagrams corresponding to FIGS. 3A to 3E referred to in the first embodiment. First, when the same light element as in the first embodiment is used (FIG. 6A), an electrode land 800 corresponding to each of the electrode 301a and an electrode 301b is separated into three separated electrode lands 800a, 800b, and 800c having a width of 0.24 mm (=1.2 mm/5) as illustrated in FIG. 6B. Next, as illustrated in FIG. 6C, when mounting the light element in an inclined state, in order to form a largest solder bump on the electrode land 800c on the highest side, the area of a metal mask opening part 803 is set to be largest. In order to form a small solder bump on the separated electrode land 800a so that the lowest side becomes a fulcrum of the inclination, the area of a metal mask opening part 801 is set to be smaller than the area of the metal mask opening part 803. Then, the area of a metal mask opening part 802 for the electrode land 800b disposed at the midpoint between the separated electrode land 800a and the electrode land 800c is set to have an intermediate area between the area of the metal mask opening part 801 and the area of the metal mask opening part 803. Further, in the case where the electrode land is separated into multiple parts in this way, the rate of increase of areas of the multiple opening parts of the metal mask corresponding to the multiple electrode lands is set so as to gradually increase at a constant rate from the opening part used on the lower side to the opening part used on the higher side.

In this way, in this embodiment, the metal mask opening part corresponding to the electrode land at which the height of the light element from the circuit substrate 300 is set to a predetermined height is set to have a predetermined area. Further, the metal mask opening part corresponding to the electrode land at which the height of the light element from the circuit substrate 300 is set to be higher than the predetermined height is set to have a larger area than the predetermined area.

Figure 6D:
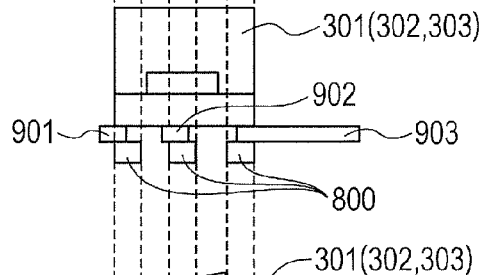
FIG. 6D is a schematic diagram illustrating the light element in a state before solder is melted when the light element is mounted on the circuit substrate according to the third embodiment.
Figure 6E:
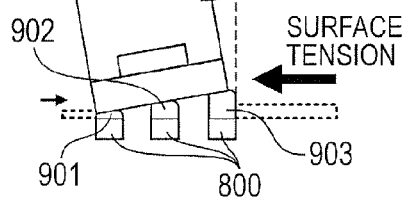
FIG. 6E is a schematic diagram illustrating the light element in a state in which the circuit substrate is heated in the reflow oven so as to melt the solder when the light element is mounted on the circuit substrate according to the third embodiment.
Figure 7:
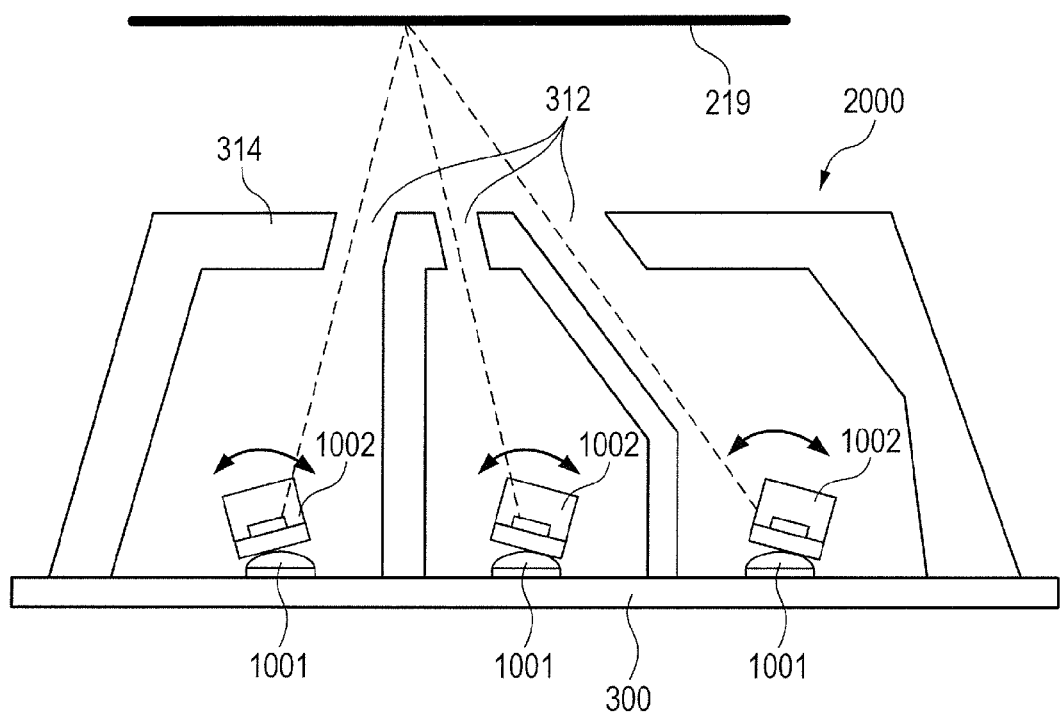
FIG. 7 is a diagram illustrating a related-art image density detector.

The largest metal mask opening part 803 is set to have dimensions of 1.6 mm by 1.2 mm and an area of 1.92 mm$^2$, and the medium size metal mask opening part 802 is set to have dimensions of 0.8 mm by 0.4 mm and an area of 0.32 mm$^2$. Further, the smallest metal mask opening part 801 is set to have dimensions of 0.4 mm by 0.4 mm and an area of 0.16 mm$^2$. The smallest metal mask opening parts 801, the medium size metal mask opening parts 802, and the largest metal mask opening parts 803 respectively correspond to the electrodes 301a and 301b of the LED 301 as the light element, and form pairs. In each of the pairs of the smallest metal mask opening parts 801, the medium size metal mask opening parts 802, and the largest metal mask opening parts 803, distances between the pairs of the metal mask opening parts 801, the metal mask opening parts 802, and the metal mask opening parts 803 can be set to different distances. The distances between the pairs of the metal mask opening parts 803 and the metal mask opening parts 801 are shifted by 0.4 mm from the position of the middle metal mask opening part 802 in a longitudinal direction of the light element as illustrated in FIG. 6C, in order to prevent a solder bridge between the electrode lands when the solder is applied through the opening parts. Further, the positions of the opening parts of the metal mask illustrated in FIG. 6C are an example, and it is sufficient that the positions can prevent occurrence of a solder bridge between the electrode lands. In other words, in order to prevent occurrence of a solder bridge between the electrode lands, an opening part position of the metal mask may be shifted in the longitudinal direction or in the transverse direction, or may be rotated by a predetermined angle so as to have a certain angle with respect to the longitudinal direction or the transverse direction. After that, solders 901, 902, and 903 are applied to the circuit substrate 300 through the metal mask opening parts as illustrated in FIG. 6D, and the light element is mounted on the applied solders 901, 902, and 903. Next, as illustrated in FIG. 6E, the circuit substrate 300 with the mounted light element is heated in a reflow oven so that the solders 901, 902, and 903 are melted.

In addition, in this embodiment, three electrode lands and three metal mask opening parts are disposed, but multiple electrode lands and multiple metal mask opening parts may be disposed. By arbitrarily changing the number of the electrode lands and the number of the metal mask opening parts, the light elements can be mounted in accordance with a type of the light elements or the inclination angles thereof. In this way, according to the mounting method of this embodiment, the image density detector 200 can utilize the light elements within an angle range of a stable light amount so that performance of image adjustment can be improved.

As described above, according to this embodiment, it is possible to mount the electronic part on the circuit substrate at an appropriate angle.

Other Embodiments

In the embodiments described above, the image density detector is exemplified as the structure including the circuit substrate on which the light elements are mounted. However, the mounting method and the circuit substrate on which the light elements are mounted according to the embodiments described above may be applied to, for example, a detection unit including the opening part 312 and the light element, such as a sensor for detecting presence or absence of the recording sheet 221 in a conveyance path for the recording sheet 221 in a range from the cassette 220 to the sheet discharging portion. Further, a result of the detection by the detection unit disposed on the conveyance path is used for performing control of image forming operation, such as control of a conveyance speed of the recording sheet 221, detection of a paper jam, detection of presence or absence of the recording sheet 221 in the cassette, and detection of a stacked state of the recording sheets 221 in the sheet discharging portion.

In the embodiments described above, the image forming apparatus having the structure as illustrated in FIG. 1 is described as the image forming apparatus including the image density detector. However, the image forming apparatus is not limited to the image forming apparatus illustrated in FIG. 1 as long as the image forming apparatus uses the method of mounting an electronic part and includes the circuit substrate according to the embodiments described above.

As described above, it is possible to mount the electronic part on the circuit substrate at an appropriate angle in other embodiments as well.

Further, the mounting method of the embodiments described above can be applied to not only mounting of light elements but also mounting of other electronic parts on the circuit substrate. In recent years, devices have been downsized so that circuit substrates have also been downsized. As a result, interference between electronic parts, interference between an electronic part and an external portion of the device, and interference between an electronic part and a wire are apt to occur. In order to avoid such interference, the electronic part is sometimes to be mounted on the circuit substrate with a predetermined inclination. In this case, using the method of mounting an electronic part and the circuit substrate according to the embodiments described above, it is possible to mount the electronic part on the circuit substrate at an appropriate angle so that the interference between the electronic parts can be avoided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-095494, filed Apr. 30, 2013, which is hereby incorporated by reference herein in its entirety.

What is claimed is:

1. An optical detector having a circuit substrate comprising:
   a light emitting element mounted on the circuit substrate;
   a light receiving element mounted on the circuit substrate;
   a first land portion to which a first electrode of the light emitting element is soldered;
   a second land portion to which the first electrode of the light emitting element is soldered;
   a third land portion to which a second electrode of the light emitting receiving element is soldered;
   a fourth land portion to which the second electrode of the light emitting receiving element is soldered;
   a fifth land portion to which a first electrode of the light receiving element is soldered;
   a sixth land portion to which the first electrode of the light receiving element is soldered;
   a seventh land portion to which a second electrode of the light receiving element is soldered; and
   an eighth land portion to which the second electrode of the light receiving element is soldered; and
   a cover member connected to the circuit substrate, configured to cover the light emitting element and the light receiving element,
   wherein the first electrode of the light emitting element and the second electrode of the light receiving element are arranged on the circuit substrate side by side,
   wherein a distance between the second land portion and the fifth land portion is greater than a distance between the first land portion and the second land portion,
   wherein a height of solder on the first land portion is higher than a height of solder on the second land portion, a height of solder on the third land portion is higher than a height of solder on the fourth land portion, a height of solder on the fifth land portion is higher than a height of solder on the sixth land portion, and a height of solder on the seventh land portion is higher than a height of solder on the eighth land portion,
   wherein the cover member has a first opening and a second opening, and wherein a light emitted to a member as an emitting object from the light emitting element passes through the first opening, and a reflected light emitted from the light emitting element passes through the first opening and is reflected by the member as the emitting object passes through the second opening and is received by the light receiving element.

2. The optical detector according to claim 1,
wherein the optical detector is mounted on an image forming apparatus, and
wherein a light from the light emitting element is emitted to an image formed on an image bearing member, and the light receiving element receives a light reflected by the image.

3. The optical detector according to claim 1, further comprising:
another light receiving element;
a ninth land portion to which a first electrode of the another light receiving element is soldered;
a tenth land portion to which the first electrode of the another light receiving element is soldered;
an eleventh land portion to which a second electrode of the another light receiving element is soldered;
a twelfth land portion to which the second electrode of the another light receiving element is soldered;
wherein a height of solder on the tenth land portion is higher than a height of solder on the ninth land portion, a height of solder on the twelfth land portion is higher than a height of solder on the eleventh land portion.

4. The optical detector according to claim 2,
wherein the image bearing member is an intermediate transfer member, and
wherein the light emitting element emits a light to a toner image formed on the intermediate transfer member from, and a the light receiving element receives the light reflected by the toner image.

* * * * *